US009490175B2

(12) United States Patent
Cheng et al.

(10) Patent No.: US 9,490,175 B2
(45) Date of Patent: Nov. 8, 2016

(54) CHEMICAL MECHANICAL POLISHING METHOD FOR FIRST INTERLAYER DIELECTRIC LAYER

(71) Applicant: SEMICONDUCTOR MANUFACTURING INTERNATIONAL (SHANGHAI) CORPORATION, Shanghai (CN)

(72) Inventors: Ji Cheng, Shanghai (CN); Jian Zhao, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/810,468

(22) Filed: Jul. 27, 2015

(65) Prior Publication Data

US 2016/0056082 A1 Feb. 25, 2016

(30) Foreign Application Priority Data

Aug. 22, 2014 (CN) .......................... 2014 1 0418523

(51) Int. Cl.
 H01L 21/8234 (2006.01)
 H01L 21/28 (2006.01)
 H01L 21/66 (2006.01)
 H01L 21/3105 (2006.01)

(52) U.S. Cl.
 CPC . *H01L 21/823456* (2013.01); *H01L 21/28035* (2013.01); *H01L 21/31053* (2013.01); *H01L 22/26* (2013.01)

(58) Field of Classification Search
 CPC .................. H01L 21/823456; H01L 21/0217; H01L 21/28035; H01L 21/31055; H01L 21/31111; H01L 22/26; H01L 27/088

USPC ........................................................ 257/392
See application file for complete search history.

(56) References Cited

U.S. PATENT DOCUMENTS

| 2010/0048007 | A1* | 2/2010 | Lee ................... | B24B 37/042 438/585 |
| 2013/0052825 | A1* | 2/2013 | Huang ................ | H01L 29/665 438/692 |
| 2013/0164930 | A1* | 6/2013 | Tu ..................... | H01L 21/31053 438/595 |
| 2014/0110794 | A1* | 4/2014 | Xie .................... | H01L 21/31053 257/401 |
| 2015/0214114 | A1* | 7/2015 | Huang ............... | H01L 21/823437 438/587 |
| 2015/0325574 | A1* | 11/2015 | Huang ................ | H01L 27/0886 257/390 |

* cited by examiner

*Primary Examiner* — Fernando L. Toledo
*Assistant Examiner* — Adam S Bowen
(74) *Attorney, Agent, or Firm* — Kilpatrick Townsend & Stockton LLP

(57) ABSTRACT

A method for manufacturing a semiconductor device includes providing a semiconductor substrate comprising a low-density region and a high-density region, forming a first gate structure in the low-density region and a second gate structure in the high-density region, form an etch stop layer on the first and second gate structures, and forming an interlayer dielectric layer on the etch stop layer and on the semiconductor substrate. The method further includes performing a first chemical mechanical polishing (CMP) process on the etch stop layer to expose a surface of a portion of the etch stop layer disposed on the first gate structure, performing a second CMP process on the etch stop layer to expose a surface of a portion of the etch stop layer disposed on the second gate structure, and performing a third CMP process to completely remove the etch stop layer.

15 Claims, 6 Drawing Sheets

US 9,490,175 B2

CHEMICAL MECHANICAL POLISHING METHOD FOR FIRST INTERLAYER DIELECTRIC LAYER

CROSS-REFERENCES TO RELATED APPLICATIONS

This application claims priority to Chinese patent application No. 201410418523.8, filed on Aug. 22, 2014, the content of which is incorporated herein by reference in its entirety.

BACKGROUND OF THE INVENTION

The present invention relates to the field of semiconductor devices, and more particularly to a method for the fabrication of a semiconductor device and a semiconductor device fabricated using the same.

With the continuous development of semiconductor technology, the performance of integrated circuits has been improved primarily though shrinking the physical dimensions of the integrated circuit components (such as transistors) to achieve faster switching speed. Currently, due to the density of components, the semiconductor industry has moved to process technology nodes at 20 nm and below. The process for manufacturing semiconductor devices is subjected to various physical constraints.

At present, the manufacturing method for an interlayer dielectric layer disposed between polysilicon gate structures may include the following steps: With reference to FIG. 1A, a semiconductor substrate 100 is provided, one or more gate structures 101 are formed on semiconductor substrate 100, a silicon nitride etch stop layer 102 is formed on semiconductor substrate 100 and on gate structures 101, and an oxide layer 103 is deposited on silicon nitride etch stop layer 102. A first chemical mechanical polishing (CMP) process is performed on oxide layer 103 until the surface of silicon nitride etch stop layer 102 is exposed, as shown in FIG. 1B. Thereafter, a second CMP process is performed on the portion of silicon nitride etch stop layer 102 disposed on the top surface of gate structures 101, as shown in FIG. 1C. However, when the physical size of a semiconductor device is scaled down to 28 nm or below, after the two CMP processes have been carried out, silicon nitride residues may remain, dishing of the interlayer dielectric layer surface between adjacent gate structures may be present, and poor uniformity may result.

Referring to FIGS. 2A-2C and FIG. 3, the problem of manufacturing a current interlayer dielectric layer according to the prior art will be described in detail.

The fabrication process of an interlayer dielectric layer may have the following two problems. Firstly, a semiconductor substrate may have a densely populated region and a sparsely populated region. The densely populated region may include closely-packed gate structures and the sparsely populated region may include sparsely-packed (widely spaced apart) gate structures. Under a severe load, a large variation in the thickness of the silicon nitride layer in the different densely and sparsely populated regions may result. For example, as shown in FIG. 2A, a semiconductor substrate 200 may include a sparsely populated region A having widely spaced apart gate structures, a medium-populated region B having medium spaced gate structures, and a densely-populated region C having closely spaced gate structures. Gate structures 201 are formed in the respective regions A, B, and C, and a silicon nitride layer 202 is formed on gate structures 201. In addition, an interlayer dielectric layer 203 is formed on semiconductor substrate 200 and on silicon nitride layer 202. The top surface of interlayer dielectric layer 203 is uneven and exceeds the top surface of silicon nitride layer 202.

Referring to FIG. 2B, a first CMP process is carried out to remove excess of the interlayer dielectric layer that is above gate structure 201. In an embodiment, after the first CMP process has been carried out, the portion of silicon nitride 202 over the sparsely-populated region A has a thickness of about 500 Angstroms, the portion of silicon nitride 202 over the medium-populated region B has a thickness of about 200 Angstroms, and the portion of silicon nitride 202 over the densely-populated region C has a thickness of about 100 Angstroms. Thereafter, a second CMP process is carried out to remove the silicon nitride layer. The second CMP process uses a slurry having a high selectivity for the silicon nitride. The polishing endpoint of the first and second CMP processes is checked by a CMP monitoring endpoint device. Residues of the silicon nitride can be found on the sparsely populated region A after the completion of the two CMP processes.

Secondly, referring to FIG. 3, a semiconductor substrate 300 may include surface regions of different morphologies. For example, semiconductor substrate 300 may include a shallow trench isolation (STI) structure 301, and a polysilicon gate layer 302 may be formed on shallow trench isolation (STI) structure 301. Because STI structure 301 has a step height, polysilicon gate layer 302 may have a relatively large thickness in the vicinity of the STI structure. Due to the fact that the polysilicon gate layer is required to have the same thickness, the semiconductor substrate may have an uneven surface. When a silicon nitride etch stop layer 303 is deposited, the portion of the silicon nitride etch stop layer on gate structure 302 disposed in the vicinity of STI 301 has a larger thickness (e.g., 200 Angstroms), and the portion of the silicon nitride etch stop layer on gate structure 302 disposed away from STI 301 has a smaller thickness (e.g., 100 Angstroms). The dotted line 1 shows a cross-section view of the surface morphology of the interlayer dielectric layer after the first CMP process. The dotted line 2 shows a cross-section view of the surface morphology of the interlayer dielectric layer after the second CMP process. When performing the CMP process, after the portion of the silicon nitride layer in the vicinity of the STI region is completely removed, residues of the silicon nitride layer remain in the region away from the STI region (indicated as a dotted ellipse 3 in FIG. 3).

In view of the foregoing, a need exists for an improved method for manufacturing a semiconductor device and a semiconductor device manufactured by the same method that can overcome the deficiencies of the prior art.

BRIEF SUMMARY OF THE INVENTION

Embodiments of the present invention provide a method for manufacturing a semiconductor device structure, and a semiconductor device fabricated using the same that is free of silicon nitride residues and has a first interlayer dielectric layer free of dishing and having a uniformly even surface.

In accordance with the present invention, a method for manufacturing a semiconductor device includes providing a semiconductor substrate comprising a low-density (sparsely-populated) region and a high-density (densely-populated) region, forming a first gate structure in the low-density region and a second gate structure in the high-density region, form an etch stop layer on the first and second gate structures, and forming an interlayer dielectric layer on the etch stop layer and on the semiconductor substrate. The method further includes performing a first chemical mechanical polishing (CMP) process on the etch stop layer to expose a surface of a portion of the etch stop layer disposed on the first gate structure, performing a second CMP process on the etch stop layer to expose a surface of a portion of the etch stop layer disposed on the second gate structure, and performing a third CMP process to completely remove the etch stop layer.

In one embodiment, the etch stop layer includes silicon nitride, and the interlayer dielectric layer includes an oxide.

In one embodiment, the first and second gate structures each comprise polysilicon.

In one embodiment, the first CMP process includes an etching selectivity of the etching interlayer dielectric layer that is higher than an etching selectivity of the etch stop layer. In an embodiment, the etching selectivity ratio of the interlayer dielectric layer to the etch stop layer is greater than or equal to 50:1.

In one embodiment, the second CMP process includes an etching selectivity of the interlayer dielectric layer that is the same or substantially equal to an etching selectivity of the etching the etch stop layer. The etching selectivity ratio of the interlayer dielectric layer relative to the etch stop layer is in a range between 0.9:1 and 1.2:1.

In one embodiment, the third CMP process uses a polishing slurry having an etching selectivity of etching the etch stop layer higher than an etching selectivity of etching the interlayer dielectric layer. The etching selectivity ratio between the etch stop layer and the interlayer dielectric layer is in a range between about 1.8:1 to about 2.5:1. The etching selectivity ratio between the etch stop layer and the first and second gate structures is greater than or equal to 5:1.

In one embodiment, the third CMP process stops when a thickness of the second gate structure reaches a predetermined value. The thickness of the second gate structure is measured using an optical endpoint monitoring device or an electric current endpoint monitoring device.

In one embodiment, the first gate structure has a width greater than a width of the second gate structure.

In one embodiment, the portion of the etch stop layer disposed on the first gate structure has a thickness greater than a thickness of the portion of the etch stop layer disposed on the second gate structure.

Embodiments of the present invention also provide a semiconductor device that is fabricated according to the above-described method.

Embodiments of the present invention also provide an electronic device that contains the semiconductor device that is fabricated according to the above-described method.

The following description, together with the accompanying drawings, will provide a better understanding of the nature and advantages of the claimed invention.

DETAILED DESCRIPTION OF THE INVENTION

Figure 1A:
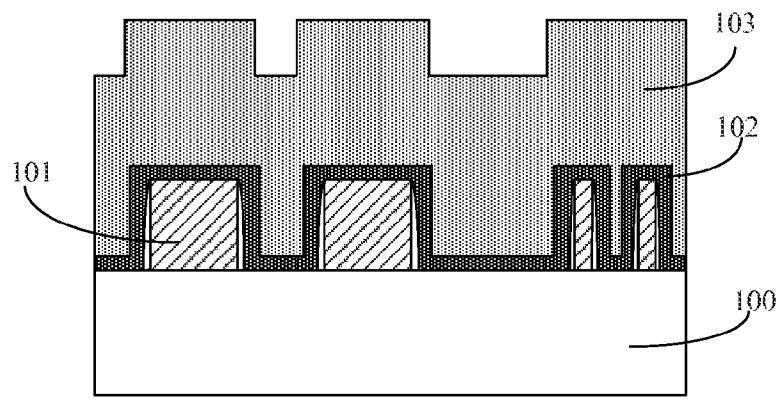
FIGS. 1A to 1C are cross-sectional views depicting stages of a method of manufacturing a semiconductor device according to the prior art.
Figure 1B:
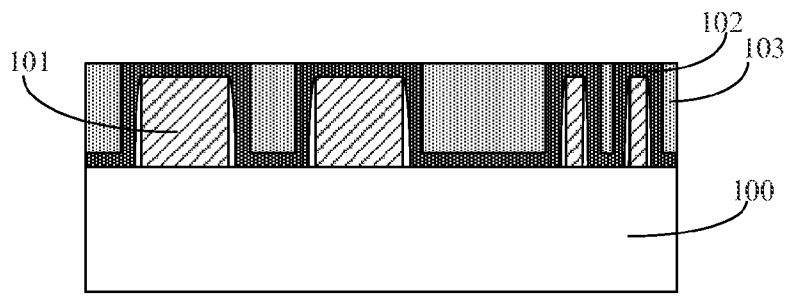
Figure 1C:
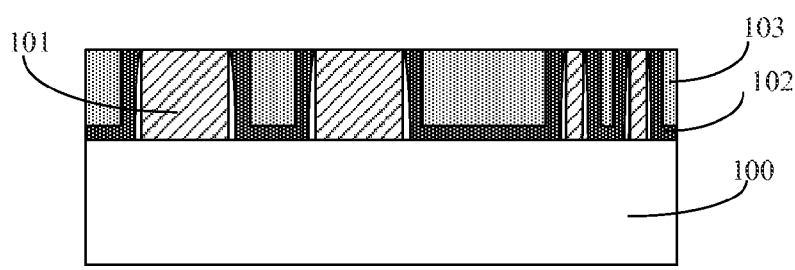
Figure 2A:
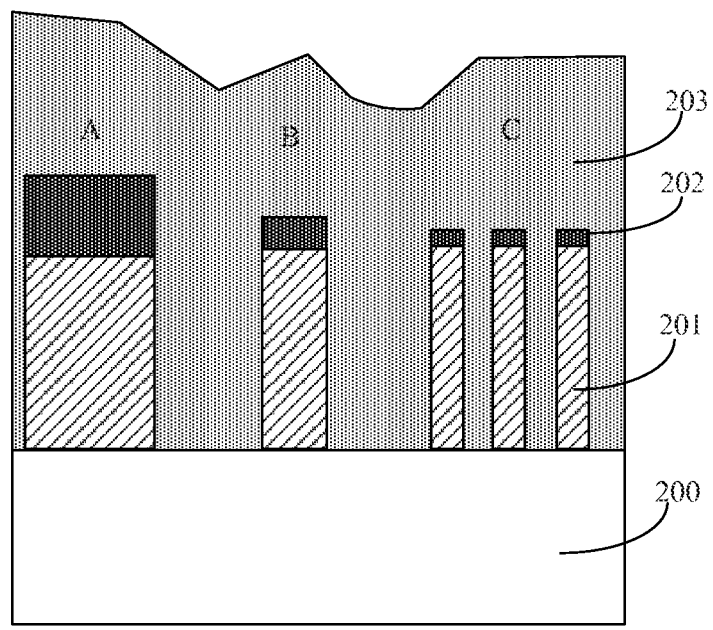
FIGS. 2A to 2C are cross-sectional views depicting stages of a method of manufacturing a semiconductor device according to one embodiment of the present invention.
Figure 2B:
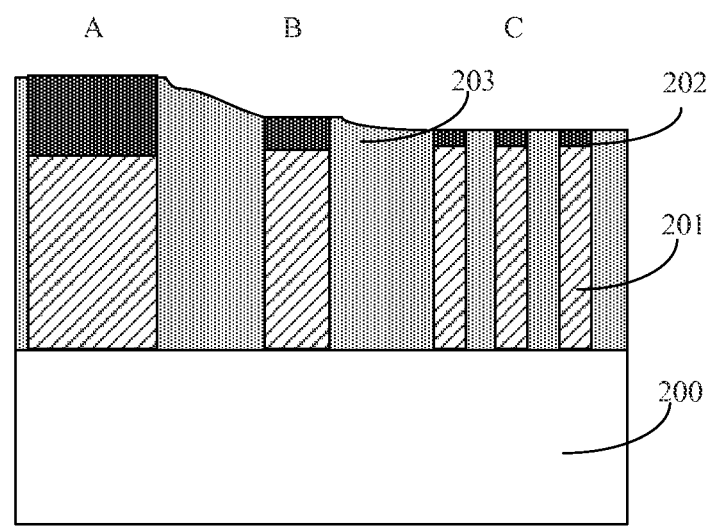
Figure 2C:
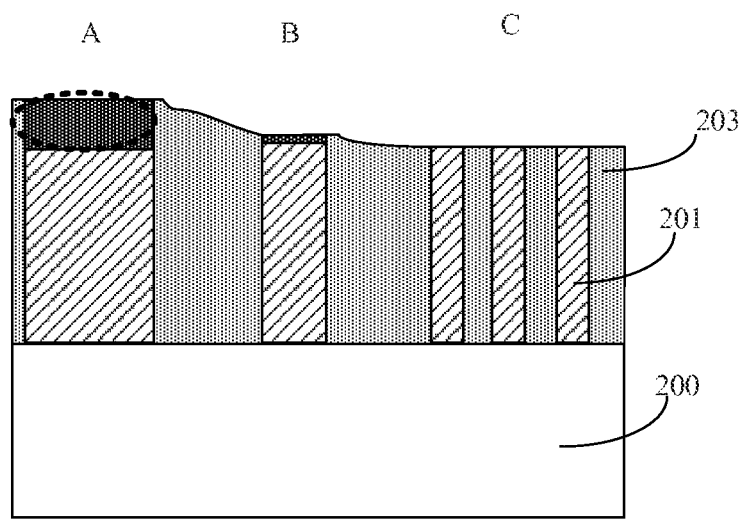
Figure 3:
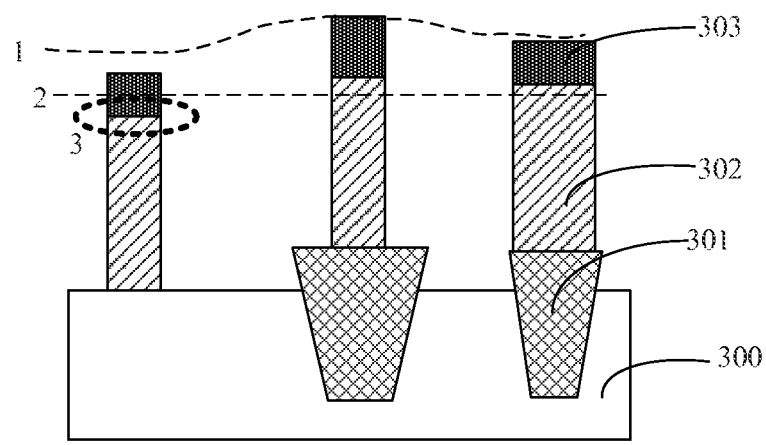
FIG. 3 is a cross-sectional view depicting residues of silicon nitride according to the prior art.

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to cross-section illustrations that are schematic illustrations of idealized embodiments (and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

It will be understood that, when an element or layer is referred to as "on," "disposed on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," directly disposed on," "directly connected to," or "directly coupled to" another element or layer, there are no intervening elements or layers present between them. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Relative terms such as "under," "below," "underneath," "over," "on," "above," "bottom," and "top" are used herein to described a relationship of one element, layer or region to another element, layer or region as illustrated in the figures. It will be understood that these terms are intended to encompass different orientations of the structure in addition to the orientation depicted in the figures. For example, if the device shown in the figures is flipped, the description of an element being "below" or "underneath" another element would then be oriented as "above" the other element. Therefore, the term "below," "under," or "underneath" can encompass both orientations of the device. Because devices or components of embodiments of the present invention can be positioned in a number of different orientations (e.g., rotated 90 degrees or at other orientations), the relative terms should be interpreted accordingly.

The terms "a", "an" and "the" may include singular and plural references. will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof Furthermore, as used herein, the words "and/or" may refer to and encompass any possible combinations of one or more of the associated listed items.

The use of the terms first, second, etc. do not denote any order, but rather the terms first, second, etc. are used to distinguish one element from another. Furthermore, the use of the terms a, an, etc. does not denote a limitation of quantity, but rather denote the presence of at least one of the referenced items.

The term "vertical" as used in this application is defined as a plane perpendicular to the conventional plane or surface of a wafer or substrate, regardless of the orientation of the wafer or substrate. The term "horizontal" refers to a direction perpendicular to the vertical as defined above.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Prepositions, such as "on", "side" (as in "sidewall"), "below", "above", "higher", "lower", "over" and "under" are defined with respect to the conventional plane or surface being on the top surface of the wafer or substrate, regardless of the orientation of the wafer or substrate. It will be understood that these terms are intended to encompass different orientations of the device in addition to the orientation depicted in the figures.

Embodiment 1

According to some embodiments of the present invention, a method for fabricating a semiconductor device can solve the problems of thickness unevenness and silicon nitride residues after CMP processes, thereby improving performance and yield of integrated circuits.

FIGS. 4A-4D are simplified cross-sectional views illustrating process steps of forming a semiconductor device according to one embodiment of the present invention.

With reference to FIGS. 4A-4D, a method of fabricating a semiconductor device may include: provide a semiconductor substrate 400. Semiconductor substrate 400 may be one of silicon substrate, silicon-on-insulator (SOI), silicon-on-insulator laminate (SSOI), silicon germanium on insulator (SiGeOI), germanium on insulator (GeOI), and the like. Semiconductor substrate 400 may include a shallow trench isolation (STI) to isolate an active region. The shallow trench isolation may be formed of silicon oxide, silicon nitride, silicon oxynitrite, fluorine-doped glass and/or other conventional low dielectric materials. Of course, semiconductor substrate 400 may also include doped well regions (not shown) and other components such as transistors, diodes, resistors, capacitors, and the like. The semiconductor substrate is represented by a box 400 herein for clarity reasons.

Semiconductor substrate 400 may include a sparsely-populated (low-density) region A, a medium-populated (medium-density) region B, and a densely-populated (high-density) region C. The term "a" may include herein singular and plural references. A gate structure 401a having widely spaced gates is disposed in the low-density region A, a gate structure 401b having moderately spaced gates is disposed in the medium-density region B, and a gate structure 401c having closely spaced gates is disposed in the high-density region C. Gate structure 401b has a spatial distribution of gate density lower than a spatial distribution of gate density of gate structure 401c. In an embodiment, the lateral width Wa of gate structure 401a (first gate structure) is greater than the width Wc of gate structure 401c (second gate structure), which is smaller than the width Wb of gate structure 401b (third gate structure). The width Wb of the third gate structure 401b is smaller than the width Wa of the first gate structure 401a.

In an embodiment, the first gate structure 401a, the second gate structure 401c, and the third gate structure 401b each include a gate and a gate dielectric layer. The gate dielectric layer may include a high-K dielectric material. Such high-K material may include, but not limited to, hafnium oxide, hafnium silicon oxide, hafnium silicon oxynitride, lanthanum oxide, zirconium oxide, zirconium silicon oxide, titanium oxide, tantalum oxide, barium strontium oxide, barium titanium oxide, strontium titanium oxide, and the like. The high-K material may be formed using any suitable processes, e.g., chemical vapor deposition, physical vapor deposition, and the like. The gate is formed overlying the gate dielectric layer. In an embodiment, the gate is a polysilicon gate and can be formed using a low pressure chemical vapor deposition (LPCVD) process.

An etch stop layer 402 is deposited on the first gate structure 401a, the second gate structure 401c, and the third gate structure 401b.

In an embodiment, the etch stop layer covering the gate structures and the semiconductor substrate may be a contact hole etch stop layer. In an exemplary embodiment, the etch stop layer may be made of silicon nitride. In an embodiment, etch stop layer 402 may be deposited on the surface of the sidewalls of the gate structures. Etch stop layer 402 may be formed by a physical vapor deposition process, a chemical vapor deposition process, or other suitable nitride forming processes. The thickness of the portion of etch stop layer 402 disposed over the first gate structure 401a is greater than the thickness of the portion of etch stop layer 402 disposed over the third gate structure 401b, which in turn, is greater than the thickness of the portion of etch stop layer 402 disposed over the second gate structure 401c. For example, the thickness of the portion of etch stop layer 402 disposed over the first gate structure 401a may be about 600 Angstroms, the thickness of the portion of etch stop layer 402 disposed over the third gate structure 401b may be about 200 Angstroms, and the thickness of the portion of etch stop layer 402 disposed over the second gate structure 401c may be about 100 Angstroms.

An interlayer dielectric layer 403 is deposited on semiconductor substrate 400 and etch stop layer 402, interlayer dielectric layer 403 has a top surface that can exceed the upper surface of etch stop layer 402. Interlayer dielectric layer 403 may be an oxide layer of a doped or undoped silicon oxide material formed using a thermal chemical vapor deposition or high density plasma (HDP) process. The undoped material may be undoped silicon glass (USG), phosphosilicate glass (PSG), or borophosphosilicate glass (BPSG). In addition, interlayer dielectric layer 403 may be a spin-on-glass (SOG) doped with boron, phosphorus, phosphorus-doped tetraethoxysilane (PTEOS), or boron-doped tetraethoxysilane (BTEOS). Under high load conditions, due to the fact that gaps with different sizes need be filled, the surface of the formed interlayer dielectric layer 403 is uneven.

Figure 4A:
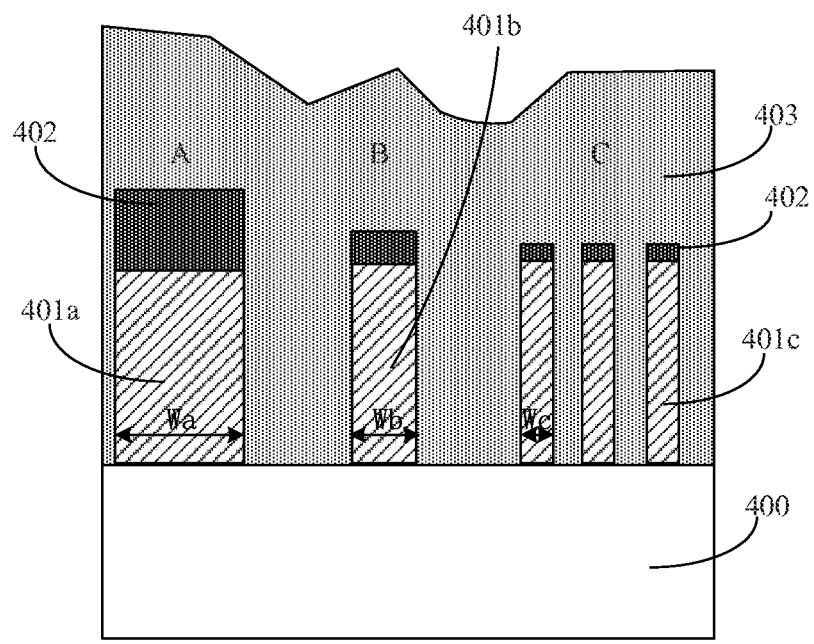
FIGS. 4A to 4D are cross-sectional views depicting stages of a method of manufacturing a semiconductor device according to one embodiment of the present invention.
Figure 4B:
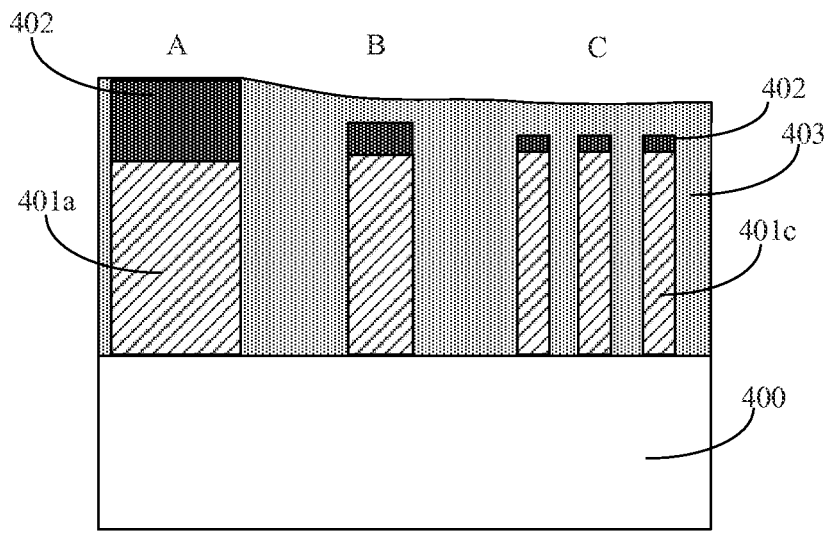
Figure 4C:
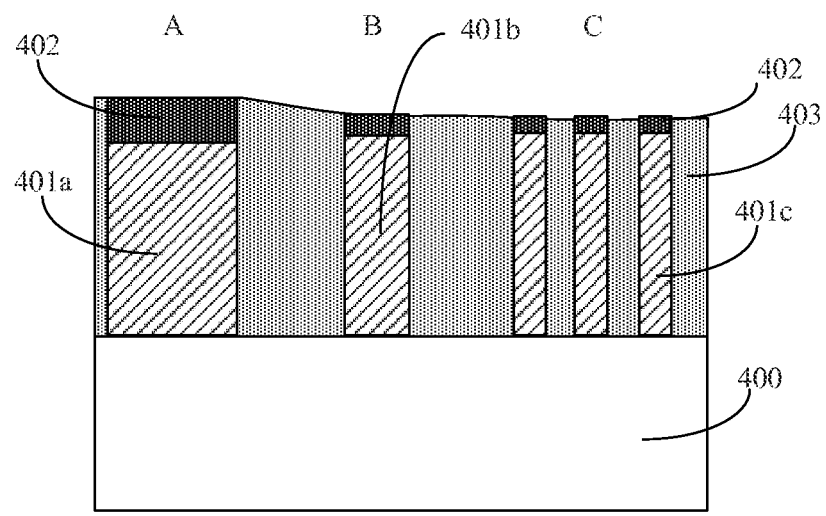

As shown in FIG. 4B, a first CMP process is performed. The first CMP process stops when the surface of a portion of etch stop layer 402 disposed on first gate structure 401a is exposed.

In an embodiment, the first CMP process uses a polishing slurry having an etching selectivity for etching interlayer dielectric layer 403 higher than an etching selectivity for etch stop layer 402, e.g., the interlayer dielectric layer to etch stop layer etching selectivity ratio is greater than or equal to 50:1. Under the effect of the polishing slurry, the polishing rate of interlayer dielectric layer 403 is much greater than the polishing rate of etch stop layer 402. In an embodiment, when the interlayer dielectric layer is an oxide, and the etch stop layer is silicon nitride, the polishing slurry may be a polishing solution of model CES333 available from ASAHI GLASS Co. Ltd. In an exemplary embodiment, after reaching the endpoint of polishing, the polishing process may continue for a short period of time to ensure that the first CMP process stops at the top surface of the portion of the etch stop layer disposed on the first gate structure. Compared to the prior art, the present embodiment has a relatively shorter time period of polishing that results in a smaller thickness loss of the portion of the etch stop layer 402 disposed over the first gate structure 401a, thereby minimizing dishing of the interlayer dielectric layer. After the first CMP process has been performed, a portion of interlayer dielectric layer 403 over the medium-density region B and high-density region C remains. The remained portion of interlayer dielectric layer 403 over the medium-density region B and high-density region C may have a thickness of about 150-200 Angstroms Referring to FIG. 4C, a second CMP process is performed. The second CMP process stops when the surface of the portion of etch stop layer 402 disposed on the second gate structure 401c is exposed.

In an embodiment, the second CMP process uses a polishing slurry having approximately the same or substantially similar etching selectivity ratio for etching etch stop layer 402 and interlayer dielectric layer 403. In other words, the polishing slurry of the second CMP process has a comparable etching selectivity for the etch stop layer and the interlayer dielectric layer. In an embodiment, the same or similar etching selectivity ratio for etching etch stop layer 402 and interlayer dielectric layer 403 is about 0.9:1 to 1.2:1, e.g., 1:1, 1.1:1, and so forth. That is, the etching selectivity of the interlayer dielectric layer and etch stop layer is within ±20 percent of each other. In an embodiment, the slurry may be a polishing solution model Semi-Sperse SS25 available from Cabot Microelectronics. Since the interlayer dielectric layer to etch stop layer selectivity ratio is the same or similar, the polishing rate of the interlayer dielectric layer and the etch stop layer is the same or similar so that the polishing is concurrently performed on interlayer dielectric layer 403 and on the portion of etch stop layer disposed on the first gate structure 401a. By controlling the polishing time duration, the second CMP process stops when the surface of the portion of etch stop layer 402 disposed on the second gate structure 401c is exposed. The portion of interlayer dielectric layer 403 disposed on the medium-density region B and high-density density region C is completely removed. In an embodiment, after the second CMP process, the thickness of the remained portion over the surface of etch stop layer 402 disposed over the first gate structure 401a is about 200 Angstroms, the thickness of the remained portion over the surface of etch stop layer 402 disposed over the second gate structure 401c is about 100 Angstroms, and the thickness of the remained portion over the surface of etch stop layer 402 disposed over the third gate structure 401b is about 150 Angstroms. Compared to the prior art, the loading effects of the etch stop layer are significantly reduced according to the present invention.

Figure 4D:
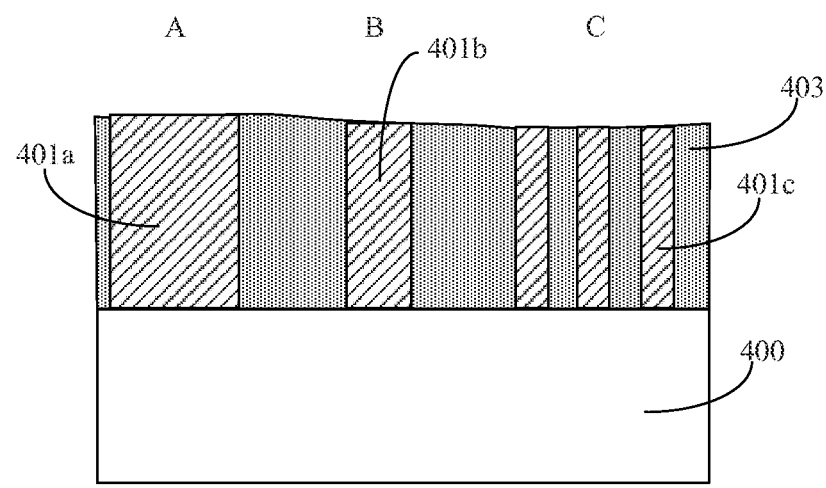

Referring to FIG. 4D, a third CMP process is performed to completely removed etch stop layer 402.

In an embodiment, the third CMP process uses a slurry having a (high) etching selectivity ratio of etching etch stop layer relative to interlayer dielectric layer 402 greater than unity. The etch stop layer to interlayer dielectric layer selectivity ratio is in the range between about 1.8:1 to about 2.5:1, e.g., 2:1. The etch stop layer to the first and second gate structures selectivity ratio is greater than or equal to 5:1. In an embodiment, the first and second gate structures each are made of polysilicon, the etch stop layer is made of silicon nitride, the interlayer dielectric layer is made of an oxide, the third polishing solution may include CeO2 and/or SiO2 abrasive particles, and by increasing inhibitors to affect the polysilicon polishing to achieve a silicon nitride/polysilicon high selectivity. The inhibitors may be polyethylene glycol, ethylene oxide, acetylene-based diol and ethylene oxide adduct, or alkoxylated linear aliphatic alcohols, and the like. A CMP device is generally equipped with endpoint detection means to detect the polishing endpoint. When a material layer is polished to a predetermined target thickness, the endpoint detection means will generate a stop signal to cause the CMP device to stop. In an embodiment, the third CMP process may use an optical endpoint detection means or an electric current detection means to detect the endpoint. In the embodiment of the present invention, through the endpoint monitoring and detection means, when the thickness of the second gate structure reaches the target value (e.g., 500 Angstroms), the CMP process stops, the silicon nitride over the first gate structure is completely removed at this time.

This completes the CMP process of the interlayer dielectric layer, which can effectively prevents a specific region of the gate structure to have silicon nitride residues, while providing a uniformly even polished surface of the interlayer dielectric layer and preventing the interlayer dielectric layer from dishing, thereby improving the product performance and yield.

Figure 5:
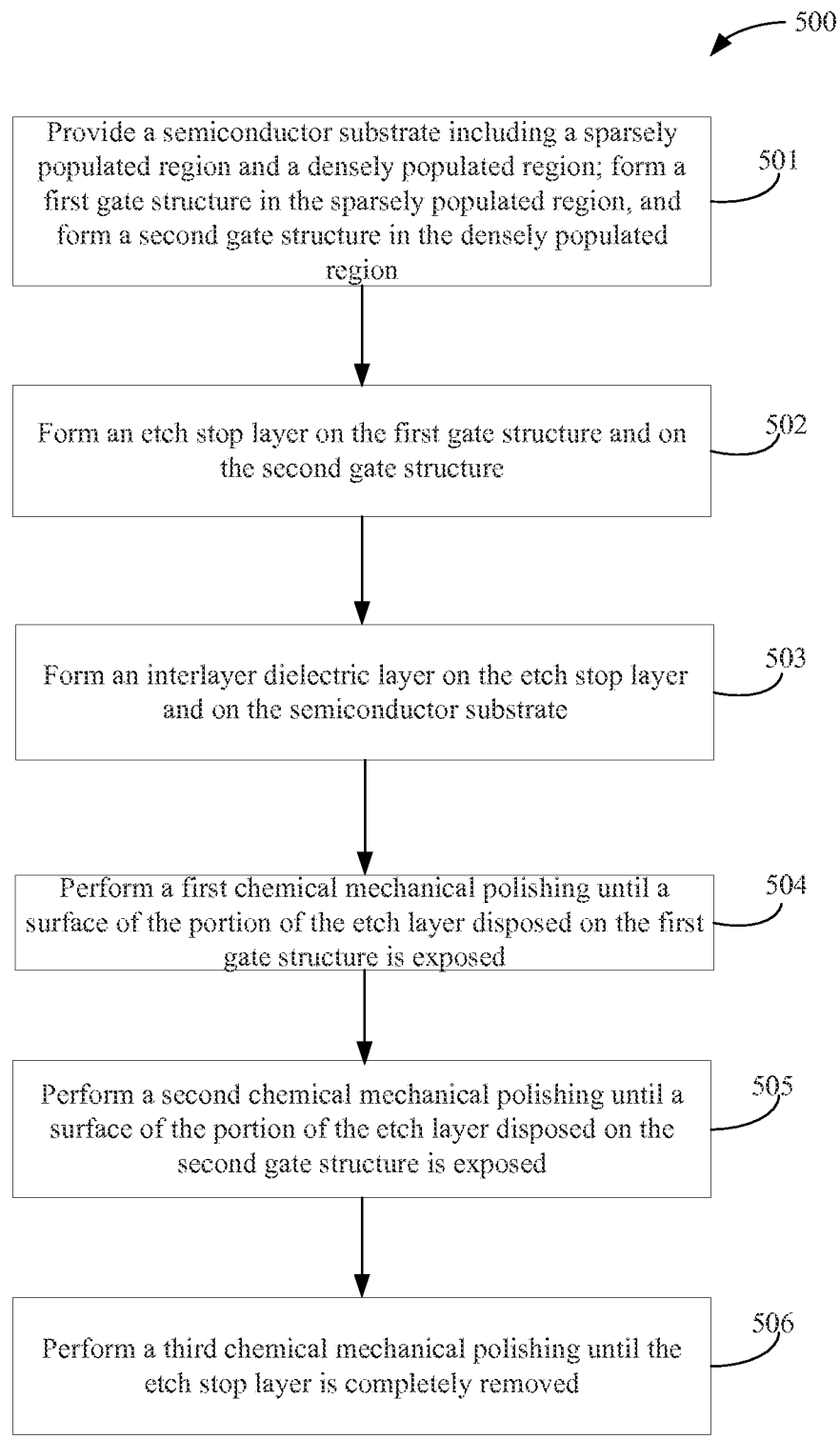
FIG. 5 is a simplified flow chart of a method of manufacturing a semiconductor device according to one embodiment of the present invention.

FIG. 5 is a simplified flow chart of a method 500 of manufacturing a semiconductor device according to one embodiment of the present invention. Method 500 may include:

Step 501: provide a semiconductor substrate (e.g., substrate 400 in FIG. 4A) comprising a sparsely populated region (e.g, region A in FIG. 4A) and a densely populated region (e.g., region C in FIG. 4A); form a first gate structure (401a) in the sparsely populated region and a second gate structure (401c) in the densely populated region;

Step 502: form an etch stop layer (402) on the first gate structure and on the second gate structure;

Step 503: form an interlayer dielectric layer (403) on the etch stop layer and on the semiconductor substrate;

Step 504: perform a first chemical mechanical polishing (CMP) process until the surface of the portion of the etch stop layer disposed on the first gate structure is exposed (FIG. 4B);

Step 505: perform a second CMP process until the surface of the portion of the etch stop layer disposed on the second gate structure is exposed (FIG. 4C); and Step 506: perform a third CMP process to completely remove the etch stop layer (FIG. 4D).

In an embodiment, the etch stop layer includes silicon nitride, and the interlayer dielectric layer includes an oxide.

In an embodiment, the first and second gate structures each comprise polysilicon.

In an embodiment, the first CMP process includes an etching selectivity of the etching interlayer dielectric layer that is higher than an etching selectivity of the etch stop layer. In an embodiment, the etching selectivity ratio of the interlayer dielectric layer to the etch stop layer is greater than or equal to 50:1.

In an embodiment, the second CMP process includes an etching selectivity of the interlayer dielectric layer that is the same or substantially equal to an etching selectivity of the etching the etch stop layer. The etching selectivity ratio of the interlayer dielectric layer relative to the etch stop layer is in a range between 0.9:1 and 1.2:1.

In an embodiment, the third CMP process uses a polishing slurry having an etching selectivity of etching the etch stop layer higher than an etching selectivity of etching the interlayer dielectric layer. The etching selectivity ratio between the etch stop layer and the interlayer dielectric layer is in a range between about 1.8:1 to about 2.5:1. The etching selectivity ratio between the etch stop layer and the first and second gate structures is greater than or equal to 5:1.

Embodiment 2

Embodiments of the present invention provide a semiconductor device that may be fabricated using the above-described method. The thus fabricated semiconductor device is free of any silicon nitride residues and has a uniformly even surface of the interlayer dielectric layer that is free of dishing so that the semiconductor device has good performance and yield.

Embodiment 3

Embodiments of the present invention provide an electronic device, which may include an electronic component and a semiconductor device electrically connected to the electronic component. The semiconductor device can be manufactured according to the method described in the above sections.

In an embodiment, the electronic device may include a semiconductor device fabricated using the above-described method. The electronic device may be a mobile phone, a laptop, a netbook, a tablet PC, a game console, a TV, a DVD player, a GPS device, a camera, a voice recorder, MP3, MP4, PSP, and other semiconductor devices including intermediate products and electronic components that are manufactured using the above-described method to improve performance and yield.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description. For example, although three regions with three different gate densities (low-density, medium-density, and high-density regions) are used, it is understood that the number of the regions can be more or fewer than three in other embodiments. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A method for manufacturing a semiconductor device, the method comprising:
   providing a semiconductor substrate comprising a low-density region and a high-density region;
   forming a first gate structure in the low-density region and a second gate structure in the high-density region;
   form an etch stop layer on the first and second gate structures;
   forming an interlayer dielectric layer on the etch stop layer and on the semiconductor substrate;
   performing a first chemical mechanical polishing (CMP) process on the etch stop layer to expose a surface of a portion of the etch stop layer disposed on the first gate structure;
   performing a second CMP process on the etch stop layer to expose a surface of a portion of the etch stop layer disposed on the second gate structure; and
   performing a third CMP process to completely remove the etch stop layer,
   wherein the third CMP process uses a slurry having an etching selectivity of etching the etch stop layer higher than an etching selectivity of etching the interlayer dielectric layer.

2. The method of claim 1, wherein the etch stop layer comprises silicon nitride and the interlayer dielectric layer comprises an oxide.

3. The method of claim 2, wherein the first and second gate structures each comprise polysilicon.

4. The method of claim 3, wherein the first CMP process comprises an etching selectivity of the etching interlayer dielectric layer that is higher than an etching selectivity of the etch stop layer.

5. The method of claim 4, wherein an etching selectivity ratio of the interlayer dielectric layer to the etch stop layer is greater than or equal to 50:1.

6. The method of claim 1, wherein the second CMP process comprises an etching selectivity of the interlayer dielectric layer that is the same or substantially similar to an etching selectivity of the etching the etch stop layer.

7. The method of claim 6, wherein an etching selectivity ratio of the interlayer dielectric layer relative to the etch stop layer is in a range between 0.9:1 and 1.2:1.

8. The method of claim 1, wherein an etching selectivity ratio between the etch stop layer and the interlayer dielectric layer is in a range between about 1.8:1 to about 2.5:1.

9. The method of claim 1, wherein an etching selectivity ratio between the etch stop layer and the first and second gate structures is greater than or equal to 5:1.

10. The method of claim 1, wherein the third CMP process stops when a thickness of the second gate structure reaches a predetermined value.

11. The method of claim 10, wherein the thickness of the second gate structure is measured using an optical endpoint monitoring device or an electric current endpoint monitoring device.

12. The method of claim 1, wherein the first gate structure has a width greater than a width of the second gate structure.

13. The method of claim 1, wherein the portion of the etch stop layer disposed on the first gate structure has a thickness greater than a thickness of the portion of the etch stop layer disposed on the second gate structure.

14. A semiconductor device fabricated according to the method of claim 1.

15. An electronic device comprising a semiconductor device of claim 14.

* * * * *